United States Patent [19]
Keller et al.

[11] Patent Number: 5,278,503
[45] Date of Patent: Jan. 11, 1994

[54] CONFIGURATION FOR THE COMPENSATION OF EXTERNAL MAGNETIC FIELD INTERFERENCES IN A NUCLEAR RESONANCE SPECTROMETER WITH SUPERCONDUCTING MAGNET COIL

[75] Inventors: Tony Keller, Rheinstetten; Arne Kasten, Karlsruhe, both of Fed. Rep. of Germany

[73] Assignee: Bruker Analytische Messtechnik, Rheinstetten, Fed. Rep. of Germany

[21] Appl. No.: 822,116

[22] Filed: Jan. 17, 1992

[30] Foreign Application Priority Data

Jan. 19, 1991 [DE] Fed. Rep. of Germany ....... 4101481

[51] Int. Cl.$^5$ ............................................. G01V 3/00
[52] U.S. Cl. ...................................... 324/318; 324/322; 128/653.5
[58] Field of Search ............... 324/300, 307, 309, 312, 324/313, 314, 318, 319, 320, 322; 128/653.5; 335/299

[56] References Cited

U.S. PATENT DOCUMENTS

| | | | |
|---|---|---|---|
| 4,788,502 | 11/1988 | Keller et al. | 324/318 |
| 5,029,287 | 7/1991 | Dessalles-Martin et al. | 324/322 |
| 5,132,618 | 7/1992 | Sugimoto | 324/318 |

FOREIGN PATENT DOCUMENTS

3308157A1 9/1984 Fed. Rep. of Germany .
3628161A1 2/1988 Fed. Rep. of Germany .

Primary Examiner—Louis Arana
Attorney, Agent, or Firm—Cesari and McKenna

[57] ABSTRACT

In order to compensate external interfering fields inside a superconducting magnet coil, these interfering fields are measured outside of the magnet coil by means of a small induction coil in order to obtain a regulation signal, and, by means of a regulation algorithm, the current through a compensation coil is controlled. The induction coils are effectively decoupled from fluctuations of the stray field of the magnet coil and from vibrations.

29 Claims, 9 Drawing Sheets

CONFIGURATION FOR THE COMPENSATION OF EXTERNAL MAGNETIC FIELD INTERFERENCES IN A NUCLEAR RESONANCE SPECTROMETER WITH SUPERCONDUCTING MAGNET COIL

FIELD OF THE INVENTION

The invention concerns an apparatus for the compensation of external magnetic field interferences in particular from time varying field interferences in magnet fields in sample regions of superconducting magnetic coils for measurements of magnetic resonance with which the interfering field is measured by means of at least one induction coil, a voltage which is induced in the induction coil is passed to a regulating or control stage and, by means of an output signal of the regulating or control stage, a compensating current is adjusted which flows through at least one compensating coil surrounding the sample region, whereby a compensation of the field interferences whose sources are distant from the magnet coil is achieved.

DESCRIPTION OF THE PRIOR ART

This type of apparatus is known in the art from DE-OS 33 08 157 and DE-OS 36 28 161 corresponding to U.S. Pat. Nos. 4,535,595 and 4,788,502.

For various measurement purposes it is necessary to produce a magnet field of high field strength and high field homogeneity. Typical application examples are magnetic resonance measurements, that is to say, nuclear resonance or electron spin resonance, but homogeneous magnetic fields are also, by way of example, necessary for mass spectroscopy, in particular, for ICR mass spectroscopy.

In particular, in nuclear resonance technology a plurality of apparatuses are known in the art to compensate the magnetic field of an electromagnet, for practically occurring interferences be it an iron magnet, an air-core magnet, a superconducting magnet system or a combination of these types of magnets.

In addition to various techniques for the compensation of homogeneity interferences, which are not the subject of present discussion, means are also known in the art for compensating interferences which manifest themselves as time variations in the absolute magnitude of the magnetic field, typically expressed through the magnetic induction B.

In order to compensate very low frequency field interferences of this type, so-called drift phenomena, the so-called "field lock" is usually utilized in magnetic resonance technology. One takes advantage of a reference sample of decidedly narrow nuclear resonance line width, a so-called "standard", whereby the gyromagnetic ratio of this resonance line, that is to say the ratio of the resonance frequency to the magnetic field strength is exactly known. The nuclear resonance of this reference line is continuously excited and with, by way of example, a fixed measurement frequency, it is possible to recognize whether or not, in consequence of drift phenomena, it is necessary to correct the magnetic field.

In order to compensate somewhat higher frequency interferences of the magnetic field strength, the utilization of so-called "flux stabilization" is known in the art of iron magnets as is by way of example described in the German Journal Z.Instr. 67, pages 293 through 300 (1959). In this configuration which is known in the art, induction coils, so-called "pick-up coils" are utilized concentric to the pole faces of an iron magnet with which low frequency oscillations of the magnetic field strength can be measured, since this type of field oscillation induces an induction voltage in these coils. The induced voltage is fed to an amplifier which, for its part, produces a current which is fed to a field coil of the electromagnet. In this manner, it is possible to largely compensate field interferences in iron magnets.

From the already above mentioned DE-OS 33 08 157, an apparatus is known in the art which is utilized in a superconducting magnet system with mechanically attached refrigerator. A superconducting magnet system consists of a solenoid-like coil which is wound from a superconducting wire and is configured in the inside of a cryostat in which it is located in a bath of liquid helium. Around the innermost vessel with liquid helium, additional cold-shields and vessels with liquid nitrogen are usually located in order to maintain the extremely low temperatures necessary for the operation of the superconducting coil with as low losses as possible. With the superconducting magnet system which is known in the art, an attached mechanical refrigerator, that is to say a motor-driven cooling device, is then utilized from which two concentric cooling arms reach into the inners of the cryostat and maintain the cooling shields or the containers filled with liquid nitrogen located therein at low temperature. In this apparatus which is known in the art, measures are then taken in order to compensate for those interferences which are caused by the mechanical operation of the refrigerator. Since metallic parts whose susceptibility is not negligible move during the operation of the refrigerator, magnetic interference signals are thereby produced in the sample region which is located in the innermost region of the cryostat, which, although of very low amplitude, can nevertheless cause interference in high resolution magnetic resonance measurements.

Towards this end, the apparatus which is known in the art proposes to provide for induction coils either directly on the refrigerator or in the vicinity of the sample region, that is to say, inside of the cryostat in order to there measure the interfering signals produced by the refrigerator by means of the voltages induced in the coils and thereby to derive a compensating current for a compensating coil.

For the described application example of the compensation of interferences which are produced by a mechanical machine arranged in close proximity to the superconducting magnet coil, the described apparatus is sufficient, since the interferences during the operation of the refrigerator which are described are, with respect to their type and effect, largely predictable so that it is possible to achieve the desired compensation with relatively simple means.

In addition to such local interferences, external magnetic interferences, however, also occur whose sources are far removed from the coil of the superconducting magnet system and which are irradiated in an uncontrolled manner onto the magnet system. In particular, heavy moving mechanical parts, such as, by way of example, elevators, street cars and the like have been shown to be particularly disruptive.

Whereas, in the above mentioned iron magnets, the magnetic flux is, to a very good approximation, concentrated in the iron yoke, the superconducting magnet coils which were referred to, as solenoid coils without iron jacket or core, are relatively open and have a substantially extended stray field. However, the superconducting magnet coils of magnetic resonance spectrometers are, as a rule, operated in persistent superconducting short circuit. That means that the magnetic coil reacts to each external magnetic interference in such a manner as to exclude additional magnetic flux from its bore. In the event of an interference, the superconducting short-circuit current will correspondingly slightly increase or decrease, so that the entire magnetic flux through the coil stays constant. To a large extent, this effect already hinders, without active compensation measures, the penetration of interfering fields up to the sample location. However, the field at the actual sample location is not stabilized, rather only the integral flux through the magnet coil. Since the field of the magnet coil caused by the superconducting current and the interfering field, in general, exhibit differing spatial distributions, the field at the sample location does not remain constant during the presence of an interfering field. Since the field of the magnet coil is very homogeneous at the sample location, but not over the entire bore, this is, in particular, true for spatially homogeneous interfering fields.

Therefore, for the compensation of this type of external interference, neither the flux stabilizer known in the art of iron magnets, since with superconducting magnet coils the relationship between flux and field in the event of a interference is different than that for the field of the magnet coil, nor the apparatus known in the art from DE-OS 33 08 157 for the compensation of locally produced interferences are adequate.

In the likewise above mentioned DE-OS 36 28 161, it is proposed to overcome the difficulties in compensation of distant interferences influencing a spectrometer with a superconducting short-circuited magnet coil by providing for at least one induction coil and at least two compensating coils and by providing for, in the regulation stage, a current divider for the division of the compensating current in the two compensating coils or, by providing for at least one compensating coil and at least two induction coils and, by, in the regulation stage, providing for a voltage adder which can be supplied with the induction voltages of at least two induction coils which can be weighted differently. By means of these measures known in the art from DE-OS 36 28 161, there is, however, one additional parameter each which can be so adjusted such that, in addition to the integral flux compensation, the change of the magnetic field at the sample location can also be exactly compensated for.

The measures known in the art from DE-OS 36 28 161 have, however, the disadvantage that the induction coil(s) surround the magnetic coil of the superconducting magnet system and thereby necessarily strongly magnetically couple to this coil. In nuclear resonance spectrometer magnets, the superconducting coils are, in general, superconducting short-circuited so that they keep the magnetic flux constant. Every external magnetic interference induces, in consequence, a reaction of the magnetic coil, that is to say a temporary increase or decrease in the superconducting short-circuit current. This, on the other hand, effects a corresponding change in the outer region of the magnetic stray field of the magnet coil. Since the induction coil surrounds the magnet, said magnet induces a voltage in the induction coil in addition to that which is directly induced by the interference. The magnetic stray field of the magnet coil is a strongly inhomogeneous field which, for large distances, falls off with the third power, and in the near region, even more steeply. Thereby it has a dependence which is very different from that of the external interference which is nearly homogeneous if the interfering object is at a distant location, by way of example a street car, elevator and the like.

Of particularly negative effect are, in addition, vibrations of the magnet relative to the induction coil. Since the main magnetic field fully penetrates the induction coil, a strong interfering signal is also induced in this event, despite the fact that no external magnetic interference is present. Since this interfering signal is, however, regulated away, a magnetic field interference actually occurs at the sample location. In this case, the compensating device which is intended to eliminate magnetic interferences, actually effects such an interference. Especially in the particularly sensitive frequency region, namely in the region of 1 Hz, magnetic vibrations, by way of example, due to microphonic effects occur.

The purpose of the invention is, therefore, to further improve the apparatus known in the art such that interferences in consequence of the coupling between the induction coil and the superconducting magnet coil are largely eliminated.

BRIEF SUMMARY OF THE INVENTION

This purpose is achieved in accordance with the invention in that the induction coil is configured as a small coil which does not surround the superconducting magnetic field coil and is sufficiently separated from the magnetic field coil or is so positioned with respect to it that the magnetic coupling between the magnetic coil and the induction coil is strongly reduced. In this manner the field changes due to variations of the superconducting short-circuit current or due to mechanical vibrations of the magnet coil no longer significantly influence the induction coil.

In this fashion the underlying purpose of the invention is fully achieved.

As in the configuration known in the art and in the method known in the art, the induction coil reacts to an external interference of the magnet field, however, in contrast to the configuration known in the art, its reaction to changes emanating from the superconducting magnet coil is strongly reduced so that the regulating quantity actually corresponds to the interference. In addition, the induction coil is easier to handle and therefore easier to mount.

In a preferred embodiment of the invention, a plurality of induction coils are provided for which are arranged separated from and approximately symmetrically about the magnet coil, whereby the induction coil axis coincides with the axis of the magnet coil. The induction voltages of all the induction coils, with appropriate weighting, are combined to form a regulation or control signal.

This measure has the advantage that possible gradients in the magnetic interference field are, to first order, averaged out and that possible magnetic asymmetries in the measurement assembly or in the environment can be taken into consideration by means of the weighting. Furthermore, a combined detection signal can be obtained through a combination of at least two detection coils which is largely insensitive to fluctuations in the stray fields of the magnet coil as well as to vibrations of the magnet coil.

In a preferred embodiment, the induction coils are arranged approximately in a horizontal plane.

This measure has the advantage that they, by way of example, can be arranged on the floor or the ceiling of the measurement laboratory or on a horizontal mirror-symmetric plane of the magnet coil.

In a further preferred embodiment, the induction coils are spatially arranged about the magnet coil, by way of example, eight induction coils at the corners of an imaginary cube or parallelepiped.

This measure has the advantage that spatial gradients of the interfering magnetic fields can be particularly well measured. In addition, ceilings and floors of a measurement laboratory can be utilized for support.

In a particularly preferred embodiment, the induction coils are brought into a position where the components parallel to the axis (in general z-component) Bz of the magnetic stray field of the magnet coil is approximately zero. In the limiting case of a dipole field, such positions correspond to configurations at the so-called "magic angle" (approximately 54 degrees; $z/r=+/-\sqrt{(\frac{1}{3})}$), that is to say, on the surface of a cone parallel to the axis with the tip of the cone at the center of the magnet coil. For magnet coils of finite size, the corresponding generalized surfaces can be calculated.

Alternatively, it is possible for a plurality of induction coils to be so circuited that the magnetic flux of the stray field of the magnet coil penetrating through the entire system of induction coils vanishes. The system is then likewise effectively decoupled from the magnet coil.

This measure has the advantage that fluctuations in the magnetic field of the magnet coil do not manifest themselves as corresponding induction voltages in the induction coils, that is to say the induction coils are completely decoupled from the magnet coil. In order to achieve this effect it is in principal sufficient if, with at least two induction coils, these coils are penetrated by oppositely directed magnetic fluxes of the stray field of the magnet coil, however, with respect to a homogeneous interference field, by commonly directed magnetic fluxes. The decoupling can transpire through calculation or through analogous weighting of the two induction voltages.

In a further particularly preferred embodiment of the invention, the induction coils are brought into positions where the derivative of the z-component of the stray field of the magnet coil with respect to a specified spatial coordinate, in particular, the axis direction of the magnet coil $dBz/dz$, vanishes.

Again, for the limiting case of the dipole field, that is to say, at distances far from the magnet coil, the z-component of the magnetic stray field is proportional to $$3z^2/r^5 - 1/r^3$$

whereby z is the coordinate parallel to the axis from the magnetic coil center, and r designates the distance to this center.

Setting the derivative with respect to z to zero one obtains $$3z(3r^2 - 5z^2) = 0$$

with the solutions:

a) $z=0$ and b) $z/r = +/-\sqrt{(3/5)} = +/-0.775$

For a fixed distance (x,y) from the axis of the magnet coil, Bz has a minimum at $z=0$ increases with increasing z, vanishes at the magic angle ($z/r=\sqrt{(\frac{1}{3})}$), passes through a positive maximum at $zr=\sqrt{(3/5)}$, and finally, for further increasing z, goes asymptotically to zero. This dependence is likewise obtained for negative z values.

This means that a configuration of the induction coils in the mirror symmetric plane of the magnet coil ($z=0$) is insensitive with respect to vibrations of the magnet coil in the axial direction, as is a configuration at approximately 39° ($\cos(30°) = \sqrt{(3/5)} = 0.777$).

In the event of a vibration perpendicular to the magnetic axis, by way of example in the x-direction, the solutions for $dBz/dx = 0$ are:

a) $x=0$ and b) $z/r = +/-\sqrt{(1/5)} = +/-0.447$

That is to say, an induction coil precisely on the axis of the magnet coil ($x=0$) is insensitive with respect to such vibrations, as is a configuration at approximately 63°.

Corresponding calculations can also be carried out for other coordinates and, in particular, can also be accommodated to the case of the magnet coil of finite size. The expression "other coordinates" includes here combinations of spatial coordinates which can be matched to a dominantly occurring vibration mode.

On the other hand, it is possible to utilize a system of induction coils which, in general, is insensitive with respect to changes in the magnetic flux in consequence of vibrations of the magnetic coil.

This measure has the advantage that corresponding vibrations of the magnetic coil relative to the induction coils, do not lead to induction voltages.

As was described above for the case of inductive decoupling from the stray field, it is sufficient if the voltages caused by vibrations of the magnet coil have opposite signs in two induction coils. They can then be, by means of calculation, so weighted that the entire system effectively still remains insensitive with respect to vibrations.

Particularly preferred is a configuration and circuiting or calculated combination of the voltages of the induction coils which is insensitive to fluctuations of the stray magnetic field of the magnet coil as well as to vibrations. This is described for the simplest case of two induction coils with the vibration along z. The stray field flux through coil 1 is designated PHI1, that through coil 2 as PHI2. In order to maintain the first condition one must have PHI1 = −PHI2. The second condition requires dPHI1/dz = −dPHI2/dz. One has, as free parameters, the positions of the coils, their areas and winding numbers as well as under certain circumstances a tilting of the coil axis with respect to z, whereby one should, on the other hand, assure that oppositely oriented tipping is utilized so that no component perpendicular to the z-axis of an external stray field is encompassed. A further parameter is the relative weighting of the voltages of the induction coils. In this particularly preferred case, a system of induction coils is present which is insensitive to fluctuations of the stray field of the magnet coil, insensitive with respect to vibrations of the magnet coil, but responds to largely homogeneous field interferences.

A particularly simple configuration of two detection coils which, together, are insensitive to fluctuations of the stray field of the magnet coil as well as to vibrations along the field axis, is effected through identical detection coils at equal radial separation (x0) from the axis of the magnet coil, but in opposite axial distance (+ or −0) from the center of the magnet coil (x=z=0) at the magic angle, that is to say at positions where Bz vanishes. This is a particularly evident and simple configuration, but is in no event the only one of this kind.

The underlying purpose of the invention is also accomplished if the induction coil, with large circumference (as in prior art), is arranged approximately coaxially to the magnetic coil, whereby said coil, however, consists of two coaxial partial coils of nearly the same diameter which are connected in opposition to another. In this manner, a voltage is induced effectively only through the flux change in the intermediate space between the partial coils. The configuration has the effect of a plurality of small individual coils which are arranged at constant separation from the magnet coil about the entire circumference. The coil cross section must not be circular shaped, rather it can also, by way of example, be square or have an irregular shape. In this fashion, and through the variation of the intermediate space between the two coils, it is possible to effect a "weighting" of the individual spatial regions and thereby a matching to asymmetries in the measurement assembly or to the environment. Particularly preferred are, on the other hand, configurations with vanishing Bz in the intermediate space or vanishing derivatives of Bz with respect to a spatial coordinate, in particular dBz/dz. Particularly preferred is also the configuration of two such induction coils which are approximately symmetric to the magnet coil center or an induction coil of the mentioned type which is located on the floor or on the ceiling of the measurement room or in the mirror-symmetric plane of the magnetic coil.

In a preferred variation of the invention, the compensation coil is coaxial to the magnet coil and has a diameter which is large with respect to that of the magnet coil.

Thereby, it is particularly preferred if two coaxial compensation coils are present whose diameter, separation, and winding numbers are so chosen that, in the region of the magnet coil, as homogeneous a compensation field as possible can be produced, and in particular, a Helmholtz configuration is preferred. As a result of local circumstances of the measurement laboratory it is fully possible that, for reasons of available space, the exact Helmholtz configuration cannot be realized so that, with changed distances, diameters, and winding numbers a new optimum must be found within the confines of the boundary conditions. Clearly, the homogeneity can be even further increased if one further increases the number of compensating coils, by way of example, to four in the manner of a double Helmholtz configuration. It is thereby always significant that one produces as homogeneous a (far) field as possible over the region of the magnet coil, said field having the exact same influence on the magnet coil as an interference originating from a far removed source. Then, the superconducting short-circuit magnet coil "reacts", namely, in the same manner to the interference and correction fields.

In the configuration of the induction coil(s) in accordance with the invention and the likewise above described configuration of the compensation coil(s), an interference caused by a distant interfering source is accordingly measured without interfering overlap of contributions from the magnet coil, and translated into a homogeneous correction magnetic field at the location of the magnet coil, which there acts opposite to the interfering field. Since thereby in the case of compensation at the location of the magnet coil, two equally large approximately homogeneous fields overlap in opposite directions, there is, to a good approximation, no "reaction" by the magnetic coil, that is to say interference terms with the extremely low symmetry of the magnetic stray field do not occur or occur in a highly attenuated form, in particular, for the symmetric configuration of a plurality of induction coils which is capable of averaging over gradients.

The measure of producing the compensation field as an approximately homogeneous field over the volume of the magnet coil and not only over the volume of the sample has the advantage that, disregarding terms of high order, in the case of compensation, the entire superconducting magnet coil does not "see" an interfering field. In this case coil reactions, naturally, do not play a role. Under disadvantageous circumstances, with time varying interference fields, it is possible, namely, in addition to the field exclusion effect, for resonant-like phenomenon also to occur, that is to say, electromagnetic oscillations or magnetically excited mechanical oscillations.

In analogy to the configuration in accordance with DE-OS 36 28 161 corresponding to U.S. Pat. No. 4,788,502, the entire disclosed contents of which is hereby explicitly referred to, it is likewise possible to achieve that, through the exact positioning of one or, even simpler, from a practical point of view, through a combination of two induction coils, the totally induced voltage "zero" from an interference corresponds to the produced field "zero" in the region of the magnetic coil effected through the compensation coil(s). In the event of only one induction coil, said coil must be position at such a location where the compensation field produced by the compensation coil has the same value as in the region of the magnet coil (on the other hand it cannot be located exactly in the "region of the magnet coil"). Of course these considerations can be reasonably applied to a plurality of induction or compensation coils, that is to say, to the above mentioned configuration. As already mentioned, adaptations to local asymmetries can also be undertaken which can be calculated for a given assembly, but, preferentially, are effected through local experimentation.

Induction and compensation coil sets now comprise a regulation loop with the entire induction voltage being the regulated quantity which is to held to zero.

It is also possible to separately measure, digitize and, by means of calculation, process individual voltages into a regulation signal. The control of the compensation coil(s) then transpires by means of one or a plurality of digital analog converters. This has the advantage that weightings are not effected by means of winding numbers, position changes, or potentiometer switchings, rather can be carried out comfortably and optimized using software.

Alternatively, it is possible to completely do without a real regulation and to only effect a control. Only those additional data fields are stored in a computer which indicate which compensation coil(s) correction currents should respond to which voltages in the induction coils. In the control processing, it is possible to include a frequency response which, in particular, can take into consideration possible phase shifts due to a residual effect of the superconducting magnet coil. Whereas, for an actual regulation, a magnetic coupling between the induction and compensation coil(s) is unavoidable, in this event one can do without the coupling since this is, in fact, not desired in principle since, for control, it would have to be taken into account by means of calculation.

With a spatial configuration of the induction coils, it is also possible to measure gradients of the external interfering field. In contrast to the homogeneous components of the interference, the superconducting magnet coil does not react to these gradients, since the average value of the field of a constant gradient over the coil volume vanishes, that is to say, does not change the magnetic flux through the coil. At the location of the sample, however, the presence of a gradient can cause interference, since if it is associated with a significant field shift over the sample volume, it effects then namely, over the time period of its influence, a corresponding inhomogeneous widening of the nuclear resonance line. It is therefore envisioned, in an improvement of the invention, (also) to provide for the measurement of the spatial gradient over the induction coil (in the simplest case the gradient of the interfering field in the direction of the line connected to the induction coils corresponds to the difference of the interfering field values measured by means of these two coils divided by their distance) and, by means of correcting gradient coils which, in nuclear resonance spectrometers, are usually present within the magnet coil, to perform a compensation. Due to their antisymmetry these correcting gradient coils likewise do not couple to the magnet coil.

The control circuitry can also include a device for the identification of local interferences which manifest themselves primarily in one or at least in only a portion of the induction coils. In this case, which can be identified through a comparison among all the individual induced voltages, it is possible to either completely do without a corresponding correction current by means of the compensation coil(s) or the correcting current takes the interference into consideration in the form of a non-linear weighting of the induction signals in designated dependence on the relative size of the induced voltage in the individual induction coils. Thereby, as a rule of thumb, one has that the compensating current must be over-proportionally smaller the more the induced signal is confined to one (a few) induction coils(s), that is to say, a merely local interference is present, which although strongly influencing one induction coil, has nevertheless already significantly decreased at the location of the magnet coil.

In particular in the event of a control only, it is possible to also arrange the compensation coil within the magnet bore of the magnet coil in proximity to the sample region, since for a control only, no measurable feed-back of the correcting field onto the induction coil(s) is necessary. This has the advantage that the compensating coil is likewise small and handy and acts directly onto the sample and that, in nuclear resonance spectrometers, such a coil is, in any event, already available.

To influence the magnetic (inductive) coupling between the induction and the compensation coil(s) it is possible to introduce auxiliary coils in that one, by way of example, positions such an auxiliary coil in proximity to an induction coil while connecting it in parallel or in series to a compensation coil or vice versa. By realizing the first case, it is also possible for one, in an actual regulation, to arrange the compensation coil inside the magnet coil wherefrom although, as a very small coil, it has a very strong influence on the sample but practically no influence on the induction coil. If one then connects an auxiliary coil to the compensation coil in series and positions this in proximity to the induction coil (or to a further coil in the induction coil circuit), it is possible for one to change, in a simple manner, the inductive coupling between the induction and the compensation coil, that it to say, to optimize.

Since the magnetic interfering fields have a small amplitude and since the interesting frequencies are very low, it is possible to increase the induction of the induction coils by means of a ferro or ferrimagnetic core and, thereby, to increase its detection sensitivity.

The determination of optimal regulation or control parameters can transpire in that one simulates an external interference, digitizes and stores the voltage induced in the induction coils, and observes the interference of the above mentioned field lock. Towards this end, the regulation or control is still switched off, that is to say no current flows through the compensation coil(s). From the time dependence of the interference of the NMR lock signal it is possible to obtain a first regulation or control parameter set with which one can work in a second experiment wherein the regulation or control is switched in. From the now remaining interference of the field lock signal, it is possible to refine the parameters. This can be iteratively repeated several times until the residual interference is minimum. The regulation or control parameters obtained in this manner are stored. This procedure can then be repeated for various simulated external interferences, which finally leads to an experimentally determined characteristic line field for the relationship between the detected induction voltages and the compensating current. Instead of the simulated external interfering fields, one can also use actual interfering fields. Hereby one obtains, in this regard, a "teachable" magnetic resonance spectrometer. A first interference produces a first parameter set. Every additional interference further complements or changes this set.

In the following, the invention is further explained with reference to the drawings.

Clearly the above mentioned and the below described characteristic features are applicable not only in the respective given combination, but also in other combinations or by themselves without departing from the framework of the current invention.

Shown are:

BRIEF DESCRIPTION OF THE DRAWING

FIG. 2b top view of the magnet system of FIG. 2a

DETAILED DESCRIPTION OF THE REFERRED EMBODIMENT

Figure 1:
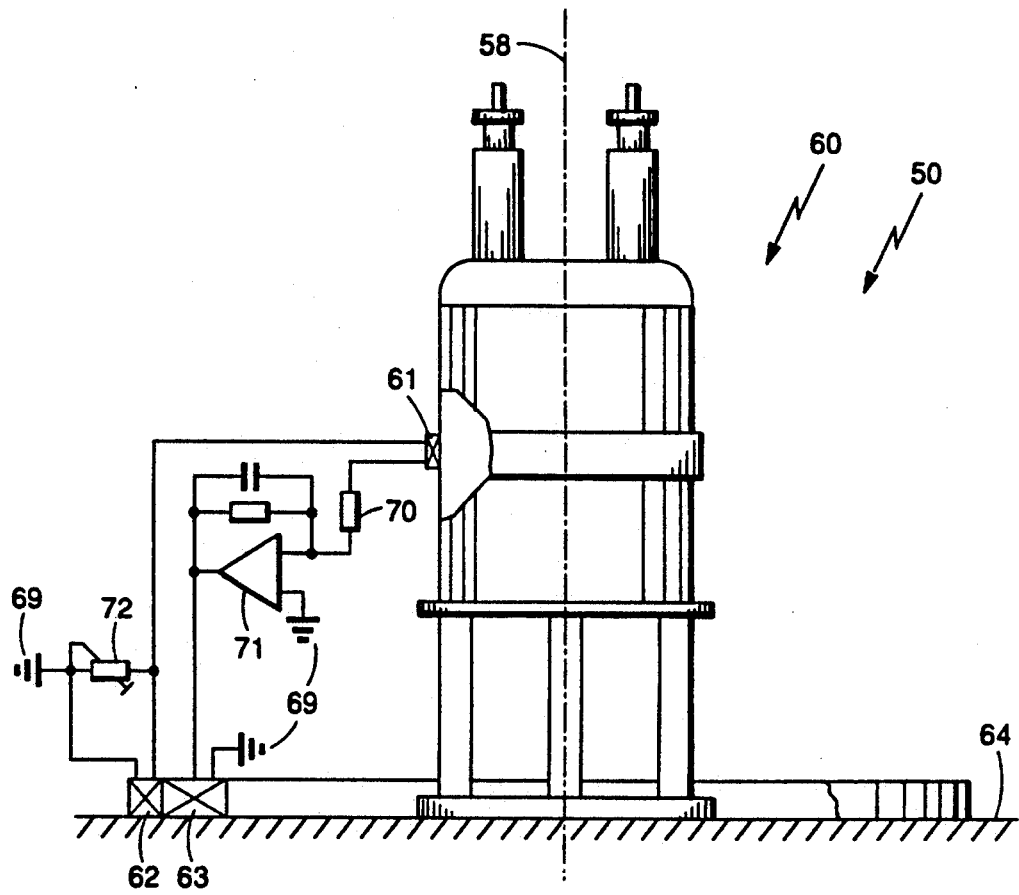
FIG. 1 a superconducting magnet system with a compensation configuration for the compensation of an interference due to a distant magnetic field according to DE-OS 36 28 161 (therein FIG. 7)

FIG. 1 shows in detail a device for the compensation of external magnetic field interferences (50) which influence the region of a magnetic coil of a superconducting magnet system inside a cryostat (60) according to prior art as described in DE-OS 36 28 161. The superconducting persistent current magnet coil (not shown) is located inside of room temperature bore of a cryostat (60). Its symmetry axis (58) coincides with that of the cryostat (60). The cryostat (60) includes a room temperature bore (not shown) along the symmetry axis (58) in which the sample region (not shown) is located at the center of the magnet coil. Arranged directly around the cryostat (60), approximately at the height of the sample region, is an induction coil (61). A further induction coil (62) is located coaxially (58) to the first (61) and to the magnet coil and a compensation coil (63), on the floor (64) below the cryostat (60) is likewise coaxial (58) to the induction coil (61, 62) and the magnet coil in the cryostat (60). The induction coils (61,62) are in series between a ground (69) and, via a pre-resistance (70), an integrating amplifier (71). The voltage addition can be adjusted by means of a potentiometer (72). The integrating amplifier (71) introduces a compensating current to the compensation coil (63) which depends on the induction voltage of the induction coils (61,62) in a predetermined fashion. The diameter of the compensation coil (63) is large compared to the dimension of the sample region inside the cryostat (60). Thereby, the compensation field produced by this coil at the sample location is very similar to a distant interference.

Since the interference and compensation fields are smaller by many orders of magnitude than the field of the magnet coil at the sample location, it is sufficient to only consider the axis-parallel components of the corresponding fields, since, although the magnitude of the entire field is, in principle, comprised of the vectorial sum of all contributions, one can neglect quadratic contributions to sufficient accuracy.

Since all coil axes in FIG. 1 coincide with the axis (58) of the magnet coil, the inductive coupling of these coils (61,62,63) among another as well, in particular, to the superconducting short-circuit magnet coil are very large, that is to say, evidently, the stray field produced by the magnet coil fully penetrates through the coils (61,62,63). In particular, the induction coils (61,62) react to fluctuations of the superconducting short-circuit current and to vibrations of the magnet coil in the cryostat (60) relative to these induction coils (61,62).

Figure 2A:
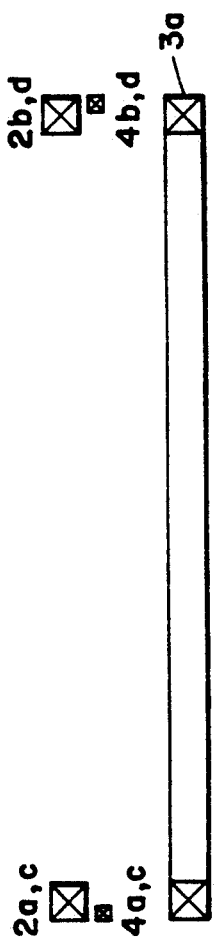
FIG. 2a a side view of a superconducting magnet coil of a superconducting magnet system with a compensating configuration according to the invention schematized in a) a side view and b) a top view.
Figure 2A:
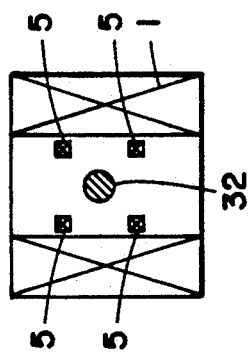
Figure 2A:
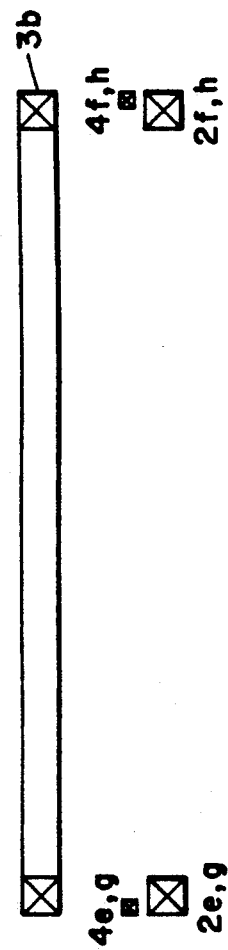

FIG. 2a schematically shows, in a side view, a preferred embodiment of a superconducting short-circuit magnet coil (1) of a magnet system with a configuration according to the invention of eight small induction coils (2a-h) at the corners of an imaginary parallelepiped about the center (32) of the magnet coil (1) and two compensation coils (3a,3b) coaxial to the magnet coil (1) in a Helmholtz configuration. The axis direction (z) of all coils (1,2,3) coincide. In contrast to the relationships in prior art (FIG. 1), the diameters of the induction coils (2a-h) are small compared to their separation from the magnet coil (1), whereby this separation, for its part, is large with respect to the dimensioning of the magnet coil (1). Correspondingly, the inductive coupling of the induction coils (2a-h) to the magnet coil (1), and the sensitivity with respect to vibrations of the magnet coil (1) is very strongly reduced. In particular, it is possible to minimize the coupling, as described in the above text, through an exact adjustment of the positions of the induction coils (2a-h). In order to sufficiently maintain the desired coupling to a (largely homogeneous) distant interference, it is possible to increase the winding numbers of the small induction coils and/or they can exhibit a ferro or ferrimagnetic core. In order to compensate for environmental asymmetries, positions, winding numbers, and the like can deviate from their exact symmetric choice. In addition, a coupling between induction coils (2a-h) and compensation coils (3a,b) can be changed with the assistance of small additional coils (4a-h) which, in the example of FIG. 2, are arranged in close proximity to the corresponding induction coils (2a-h), but are electrically connected to the compensation coils (3a,b).

In a manner not shown for reasons of clarity, it is possible that the induction coils (2a-h) be connected either simply in series and the entire induced voltage supplied to a regulation or control apparatus, or via circuitry analogous to that shown in FIG. 1, be additionally individually weighted. The compensating current thereby derived is thereupon introduced to the compensation coils (3a,b) and, if applicable, to the additional coils (4a-h).

Alternatively, the induction voltages can be individually or in collected groups introduced to a regulation or control unit. Preferentially, the individual signals are digitized here and introduced to a computer which, according to a predetermined algorithm, derives values for the compensation current from the induction voltages. Via one or a plurality of analog to digital converters and amplifiers, the compensation coils (3a, 3b) are supplied with the currents so derived.

Through the construction of differences between individual induction voltages, it is possible to derive gradients of an interfering field (Bz) with respect to all spatial coordinates, that is to say dBz/dx, dBz/dy and dBz/dz. From these it is possible, on the other hand, to determine correction currents for gradient coils (5) which, in general, are arranged inside the magnet coil (1). If the gradient coils (5) are supplied with these correcting currents, magnetic field gradients due to a non-homogeneous interference are, to first order, eliminated in the sample region.

The Helmholtz configuration of the compensating coils (3a,3b) shown in FIG. 2 produces a particularly homogeneous compensation field which is quite homogeneous over, if possible, the entire region of the magnet coil (1). Clearly, this configuration has only exemplary character. Thereby, in further improvements of the homogeneity, it is possible to increase the number of compensation coils (by way of example, a double Helmholtz configuration). On the other hand it is possible to deviate from the exact Helmholtz configuration in order to compensate for asymmetries in the environment or if, due to space constraints, certain positions of the coil are not possible. Thereby, solutions are conceivable wherein the coils (3a,3b) have differing distances from the magnetic coil center, differing diameters and differing winding numbers. The shape of the coil can also deviate from a circular shape. In principle, one can do without one of the coils (3a,3b) while accepting a deterioration in the homogeneity.

Figure 2B:
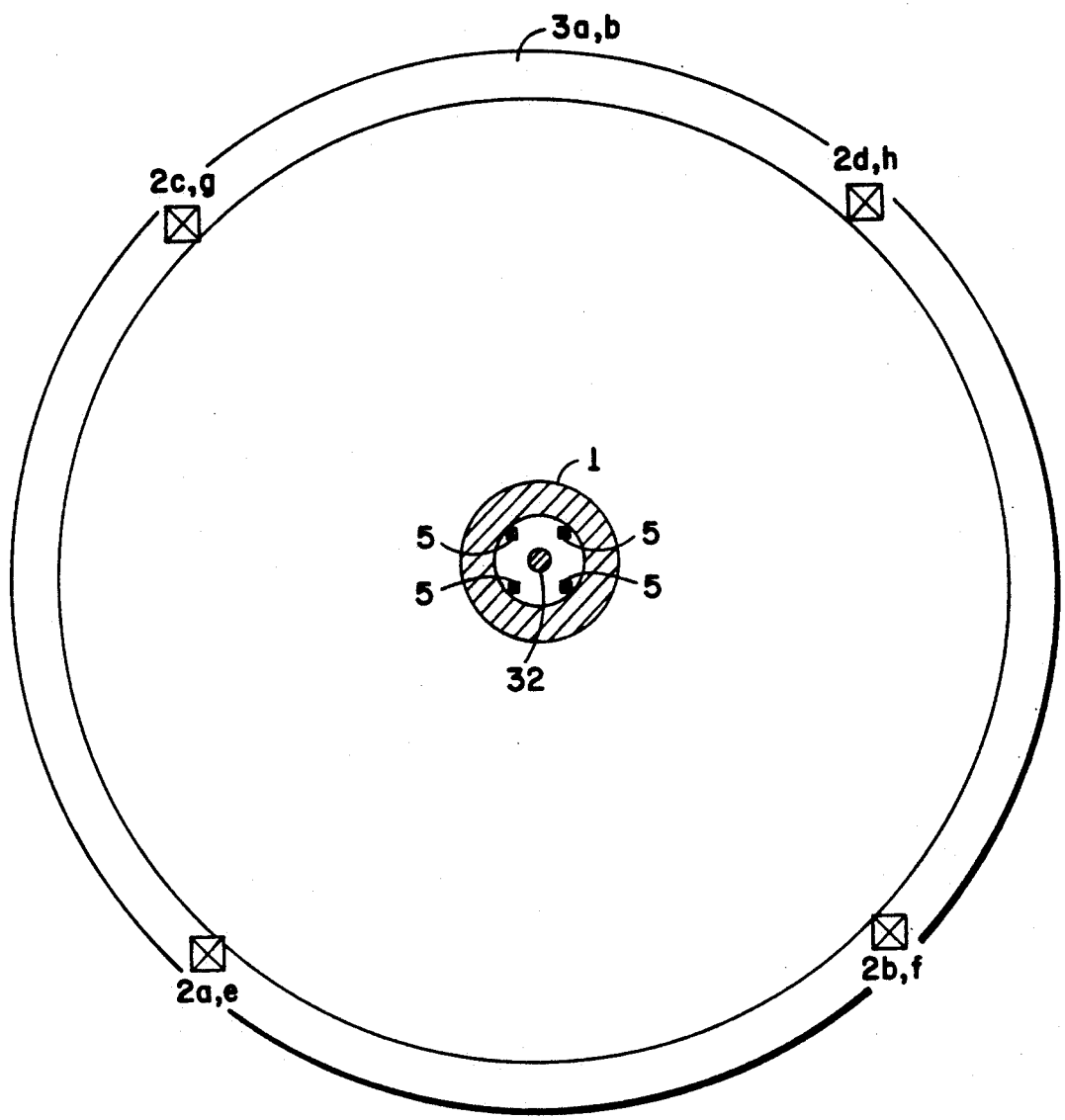

FIG. 2b shows the configuration of FIG. 2a in a top view.

Figure 3A:
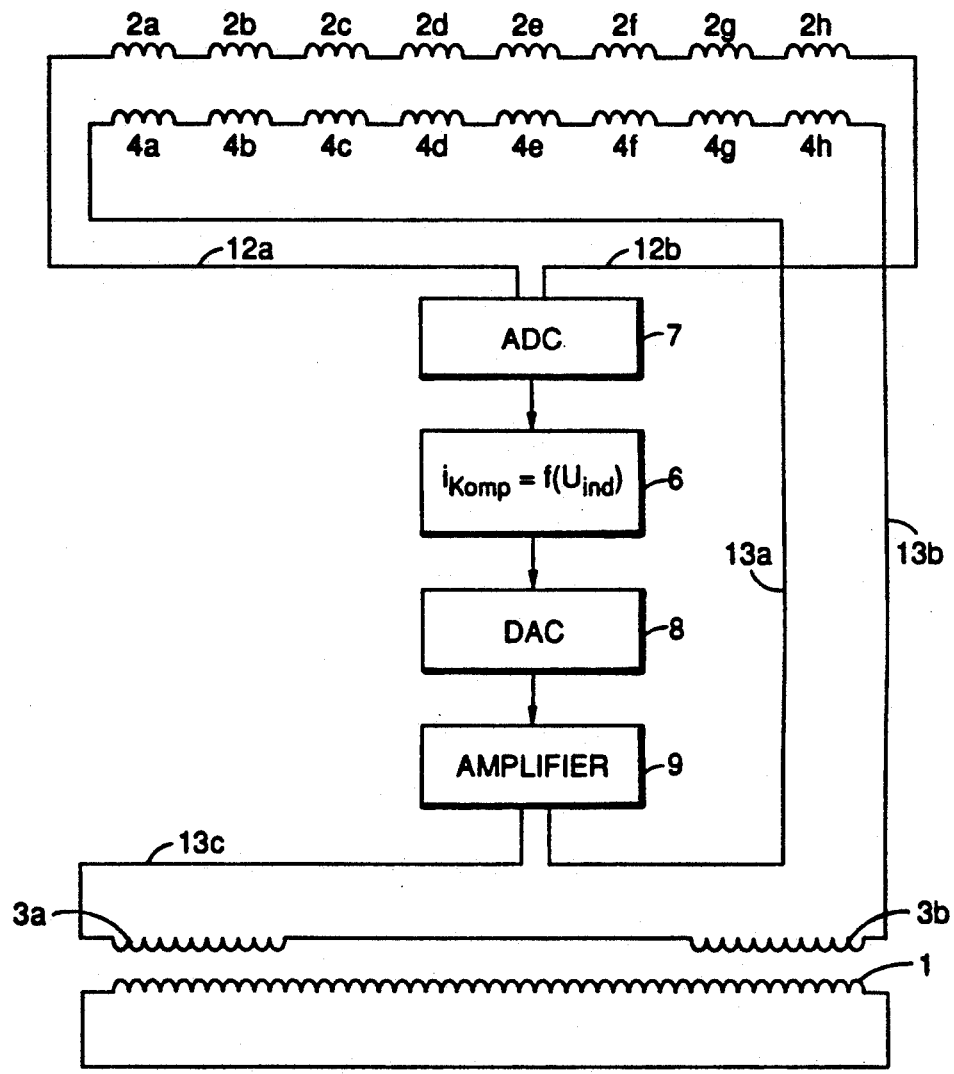
FIG. 3a a schematic block diagrams of an embodiment according to the invention of a circuitry with 8 induction coils, 8 additional coils and 2 compensation coils.
Figure 3B:
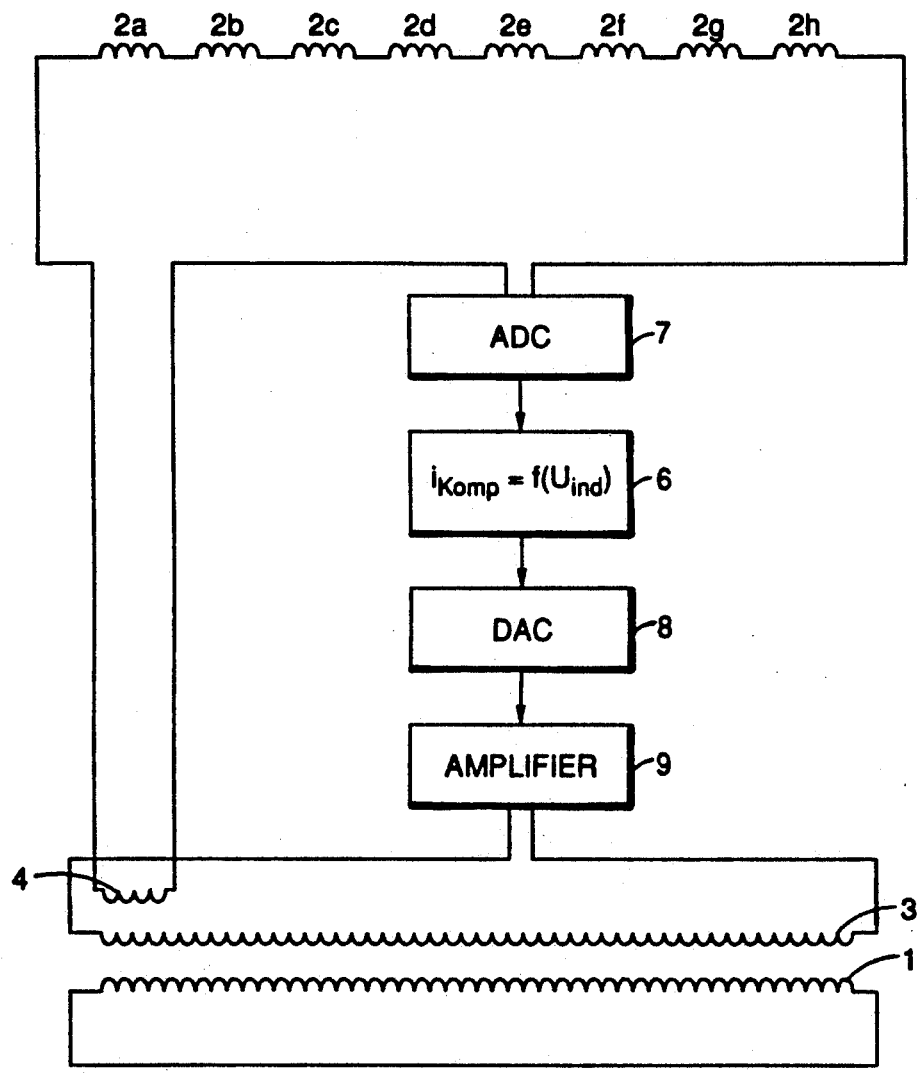
FIG. 3b a schematic block diagram of an embodiment according to the invention of a circuitry with 8 induction coils, one compensation coil, and an additional coil.
Figure 3C:
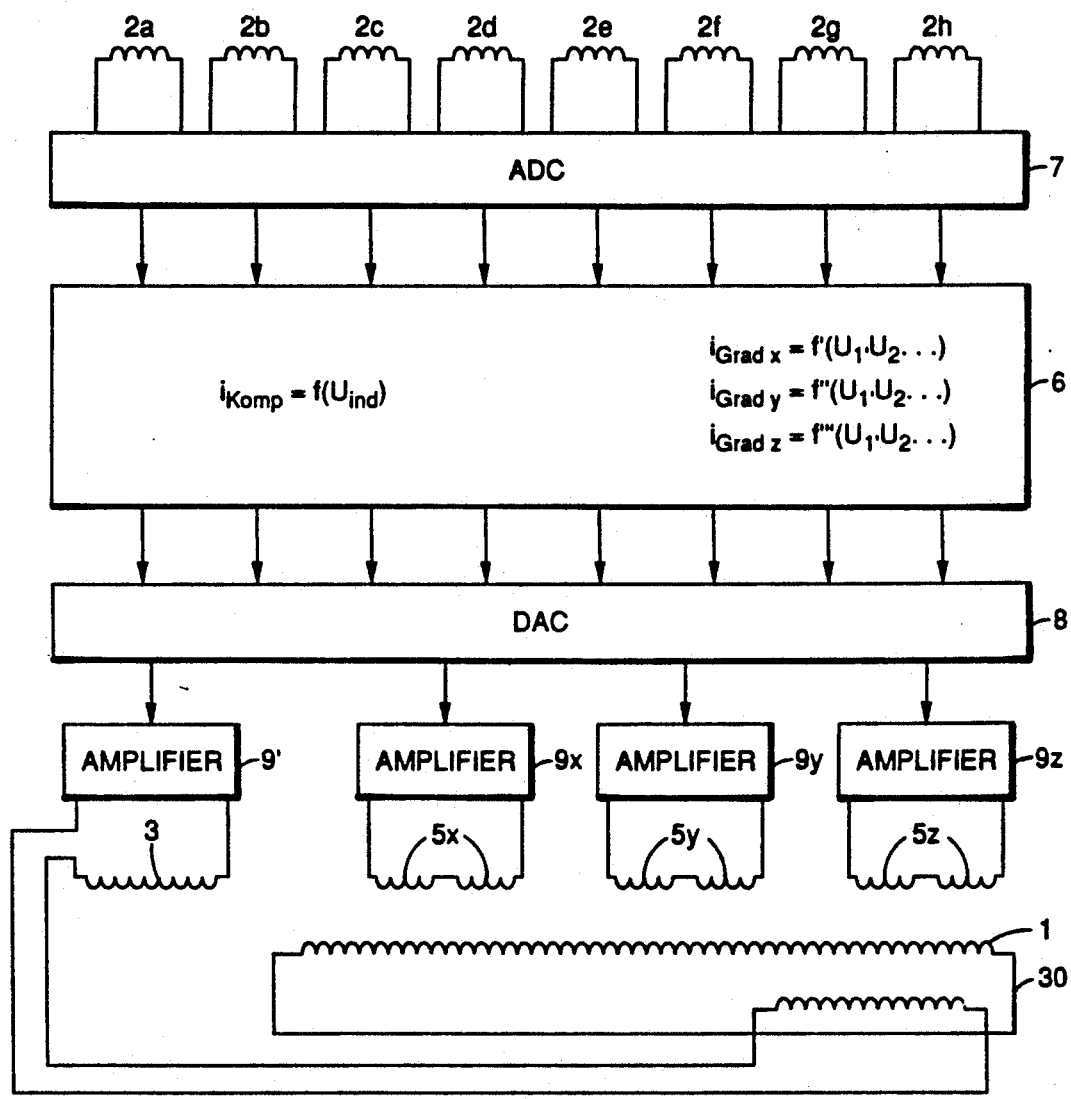
FIG. 3c a schematic block diagram of an embodiment of the invention of a circuitry with 8 induction coils, 3 gradient compensation coils, and a compensation coil.

A possible electric circuiting of the induction coils (2a-h), compensation coils (3a,3b), additional coils (4a-h) and the superconducting magnetic coil (1) of FIG. 2 is shown in FIG. 3a. The induction coils (2a-h) are connected in series. The induced entire signal reaches, via conductors (12a,b), an analog digital converter (ADC,7) which digitizes the signal and feeds it to a computer (6). Said computer delivers, according to a predetermined regulation or control algorithm, control signals to a digital to analog converter (DAC,8) wherein they are converted by means of an amplifier (9) into a compensation current, which is fed to, via conductors (13a,b,c) to the series-connected additional coils (4a-h) which, in turn, are inductively coupled to the appropriate induction coils (2a-h) and to the compensation coils (3a,b). In principle, one additional coil (by way of example 4h), which is inductively coupled to one of the induction coils (by way of example 2h; or a further auxiliary coil connected in series to the induction coil) is sufficient. The compensation coils (3a,b) couple inductively to the superconducting short-circuited magnet coil (1). FIG. 3b shows in an alternative configuration with eight induction coils (2a-h), only one compensation coil (3), and an additional coil (4) inductively coupled to the compensation coil (3), but electrically connected to the induction coils (2a-h). As already mentioned, it is possible to do without the additional coil(s) (4), in particular, if the computer (6) utilizes the input signal from the ADC (7) only to control the output current of the DAC (8) effected by means of amplifier (9) according to a predetermined algorithm, and does not simply regulate the input signal to zero. As in FIG. 3a, the compensation coil (3) couples inductively to the superconducting short circuited magnet coil (1). FIG. 3c shows the circuiting of a further preferred embodiment. The induction voltages of eight induction coils (2a-h) are individually measured by means of an ADC stage (7'), digitized and introduced into a computer (6). The computer calculates, according to a predetermined algorithm and with the assistance of these values, the induction voltage values for compensation currents which, via a DAC stage (8') and amplifier (9', 9x, 9y, 9z), are introduced into the compensation coils (3) and to three further gradient compensation coils (5x, 5y, 5z). The compensation coils (3) couple inductively to the superconducting short circuited magnet coil (1). Due to their anti-symmetry, in contrast, the gradient compensation coils (5x, 5y, 5z) do not couple. The gradient compensation coils (5x,y,z) are, in general, located inside the magnet coils (1) and surround the center of the magnet coil, that is to say the sample space. The compensation coil (3) can also be so configured (by means of example as a small Helmholtz coil) and can, thereby, like the induction coils, remain small and handy. In the event that one wants to reduce or eliminate the coupling between the magnet coil (1) and the compensation coil (3), it is possible to introduce a further coil (30) at a separation from the sample region but still within the magnet bore and to connect said coil, with oppositely directed winding sense, in series to the compensation coil (3). With oppositely directed equal coupling of the individual coils (3,30) to the magnet coil, the total coupling vanishes, but a residual compensation field remains in the sample region.

Figure 4:
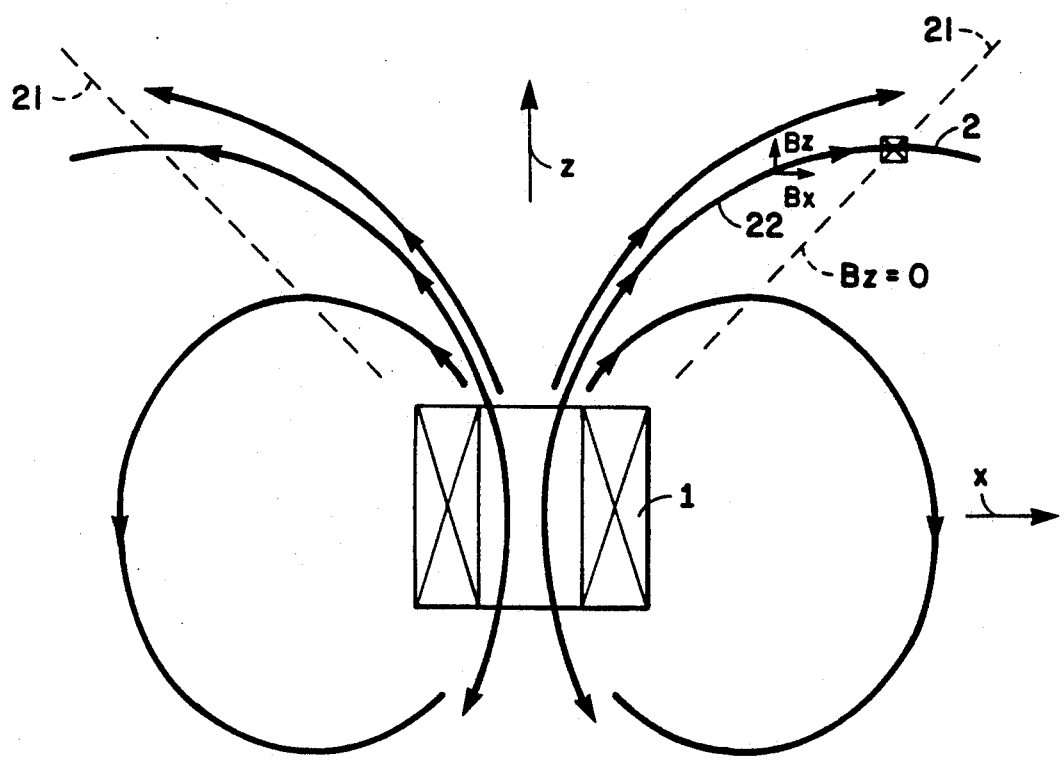
FIG. 4 a superconducting magnet coil of a superconducting magnet system with a compensation configuration according to the invention schematized in a side view, whereby the induction coil of the compensation configuration is located in a position with vanishing axis-parallel component Bz of the stray magnetic field of the magnet coil.

FIG. 4 schematically shows, in a side view, a superconducting magnet coil (1) with a vertical z-axis as symmetry axis. In the outer region, the field lines of the magnetic stray field are indicated by means of curved lines. A dotted line (21) indicates where, in the sectional plane, the z-component of the stray field vanishes, that is to say, where the field lines run horizontally. Due to the rotational symmetry of the configuration, the lines (21) represent a rotationally symmetric surface about the z-axis. On a field line (22), the splitting of the vector of the local stray field into two components $B_z$ and $B_x$ is schematically indicated.

An induction coil (2) for the detection of an external interference field, with its coil axis parallel to z is, in this example, so placed that at its position no z-component of the stray field is present, that is to say, it is located on the mentioned dotted line (21). In this configuration, a change in the current through the magnet coil (1) does not induce a voltage in the induction coil (2).

As mentioned in the text, instead of the line (21) or the corresponding rotationally symmetric surface, it is possible to locate such lines (surfaces) upon which the derivative of the z-component of the stray field with respect to given spatial coordinates, in particular $dB_z/dz$, vanishes, so that an induction coil (2) positioned on such a line is insensitive with respect to vibrations of the magnet coil (1) along this spatial coordinate.

Figure 5:
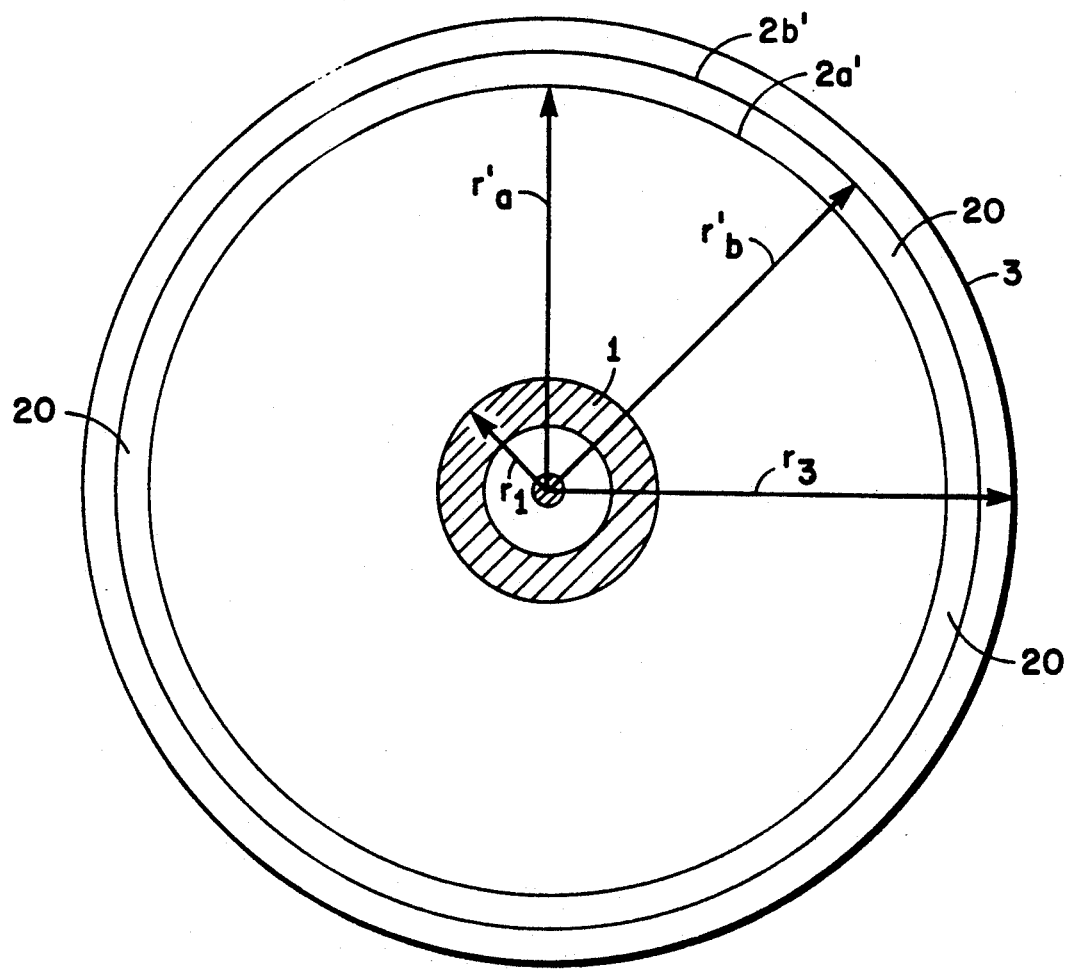
FIG. 5 a top view of a superconducting magnet coil surrounded by a compensation and induction coil configuration according to a further embodiment of the invention.

FIG. 5 shows, in a top view, a further embodiment of the invention with which the induction coil consists of at least one pair of coaxial partial coils (2a', 2b') of somewhat differing radii (ra', rb'). In the embodiment, the compensation coil (3) has a still somewhat larger radius (r3). All three coils (2a', 2b', 3) coaxially surround the magnet coil (1) whose radius (r1) is small compared to the radii ra', rb' and r3. The difference between the radii rb'-ra' is small compared to ra'. The partial coils (2a', 2b') are connected in anti-series, that is to say, only a magnetic flux change in the radial region (20) between ra' and rb' induces a net voltage. This region (20) is, however, far removed from the magnet coil (1), so that its influence is already strongly reduced. In addition, it is possible for the position of at least two partial coils (2a', 2b') to be axially so chosen that fluctuations in the axial components of the stray field of the magnet coil (1) due to current fluctuations or vibrations vanish, as was described above.

Figure 6A:
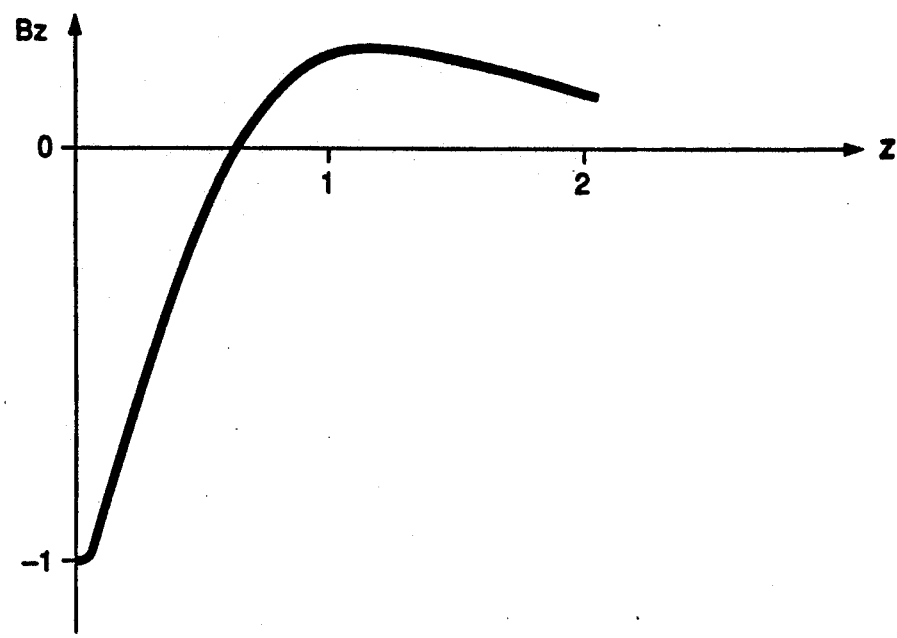
FIG. 6a the z dependence of the axis parallel z-component of the magnetic field of the magnetic, stray field Bz of an ideal dipole for a fixed separation (x0=1) from the dipole axis as a function of z, in arbitrary units.

FIG. 6a the dependence of the z-component of the stray field of a magnetic dipole on the axis-parallel coordinate z for a fixed distance $x0=1$ from the axis. For $z=0$, the field is negative and of largest magnitude. $B_z$ increases steeply with increasing z, and changes sign approximately at $z=0.7$. Approximately at $z=1.2$, $B_z$ achieves a positive maximum which, however, with respect to its magnitude, is five times smaller than the minimum at z=0 and, thereafter, falls for still larger z values asymptotically to zero. The zero crossing at approximately z=0.7 precisely corresponds to the above mentioned magic angle. The function Bz(z) is symmetric in z, that is to say, Bz has the same value for a corresponding positive or negative z-value.

Figure 6B:
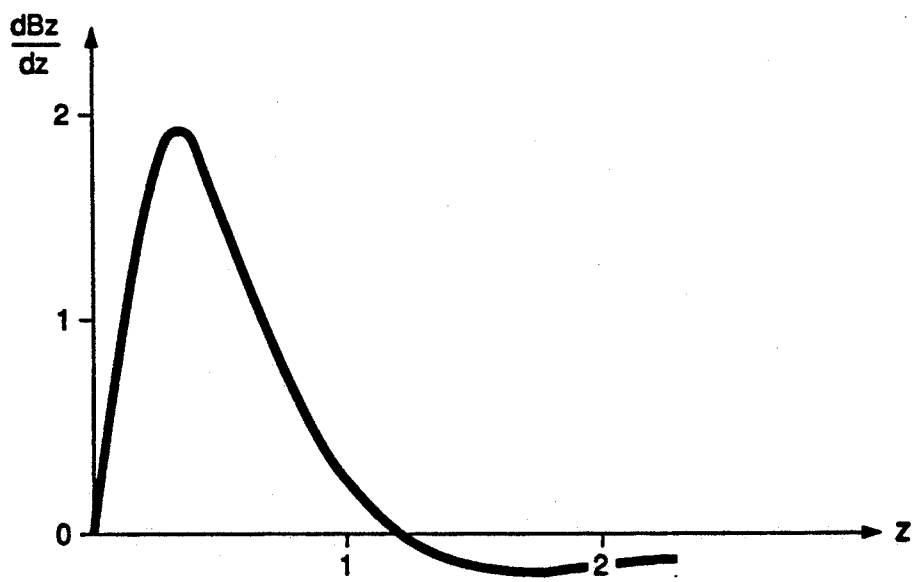
FIG. 6b The dependence of FIG. 6a, but for the derivative with respect to z of Bz, dBz/dz.

FIG. 6b shows the derivative dBz(z)/dz. It increases initially steeply from zero at z=0, achieves a positive maximum at approximately z=0.36, decreases steeply again, changes its sign at approximately z=1.2, has a negative minimum at approximately z=1.7, and then goes asymptotically to zero. Function dBz(z)/dz is antisymmetric in z, that is to say, it changes its sign at z=0.

From the FIGS. 6a and b, one sees that it is easily possible, even for a fixed x0, to locate two positions where Bz=0 and dBz/dz has the opposite sign (z=+/−0.7). The combination of two identical detection coils at these positions is therefore particularly advantageous. This is, however, only a special case. Through variation of the winding numbers and the cross sections of the detection coils and their configuration to positions of arbitrary radial separation, it is possible for many further combinations to be found which fulfill the condition that the effective total flux of the stray field and its derivative with respect to a coordinate vanish. These considerations can be generalized for the case of real stray fields which deviate from an ideal dipole shape and, by utilizing a plurality of detection coils, can be extended to the compensation of the derivatives with respect to a plurality of generalized coordinates. In this fashion it is possible to design an entire detection coil system which is insensitive to fluctuations of the stray field and all relevant vibration modes. The combination of the voltages induced in the individual detection coils must not transpire in an analog fashion, rather it can also be carried out with a computer to which the individual voltages are introduced in digitized form. In this case, it is possible to effect the regulation or control algorithm in a yet more flexible fashion.

We claim:

1. Apparatus for use with a superconducting magnet coil which generates a main magnetic field having a field direction lying along an axis in a sample region, the apparatus compensating for interference caused by components of a time-varying magnetic field generated by means external to the sample region which components lie along the axis, the apparatus comprising:

a compensation coil surrounding the sample region for generating compensation fields in the sample region;
   an induction coil having a diameter sufficiently small that the induction coil does not surround the sample region and the induction coil being physically positioned at a location where substantially all the voltage induced in the induction coil is produced by the external field axial components; and
   control apparatus responsive to the voltage induced in the induction coil for applying a compensation current to the compensation coil in order to generate compensation fields which cancel the external field axial components in the sample region.

2. Apparatus according to claim 1, wherein the main magnetic field has an axial component extending along the axis and the induction coil is physically positioned at a location where a derivative in a predetermined direction of the main magnetic field axial component substantially vanishes.

3. Apparatus according to claim 1, wherein the magnetic coil has a center and wherein the induction coil is physically displaced from the center along the axis by a displacement and located off the axis and the ratio of the displacement to a distance from the location to the center is substantially 0.577.

4. Apparatus according to claim 1 comprising two induction coils, one of the two induction coils being physically positioned at a first location where the main magnetic field extends in a first direction and the external field axial components extend in a second direction and the other of the two induction coils being physically positioned at a second location where the main magnetic field extends in a third direction opposite to the first direction and the external field axial components extend in the second direction.

5. Apparatus according to claim 1 wherein the magnet coil generates a stray field which induces a voltage in the induction coil and the apparatus further comprises a second induction coil positioned so that a variation of the stray field induces a voltage in the second induction coil, the control apparatus being responsive to voltages induced in the induction coil and the second induction coil for combining the voltages induced in the induction coil and the second induction coil to cancel the voltages induced in the induction coil and the second induction coil by variations of the stray field.

6. Apparatus for use with a superconducting magnet coil with an axis which generates a main magnetic field having a field direction lying along the axis in a sample region, the apparatus compensating the interference caused by components of an time-varying magnetic field generated external to the sample region which components lie along the axis, the apparatus comprising:

a compensation coil surrounding the sample region for generating compensation fields in the sample region;
   a first partial induction coil physically positioned coaxially to the magnet coil and having a first diameter;
   a second partial induction coil physically positioned coaxially to the magnet coil and having a second diameter less than the first diameter to form a radial region between the first and second partial induction coils, the first and second partial induction coils being electrically connected in series so that voltage induced in the first and second partial coils is due to a time-varying magnetic field in the radial region and wherein the first and second diameters are sufficiently large that the time-varying magnetic field in the radial region is substantially due to the external field axial components; and
   control apparatus responsive to the voltage induced in the first and second partial induction coils for applying a compensation current to the compensation coil in order to generate compensation fields which cancel the external field axial components in the sample region.

7. Apparatus according to claim 6, wherein the main magnetic field has an axial component extending along the axis and the first and second partial induction coils are physically positioned at a location where a derivative in a predetermined direction of the main magnetic field axial component substantially vanishes.

8. Apparatus according to claim 6, wherein the magnet coil has a center and wherein the first and the second partial induction coils are physically displaced from the center along the axis by a displacement and located off the axis and the ratio of the displacement to a distance from the location to the center is substantially 0.577.

9. Apparatus according to claim 6 wherein the magnet coil generates a stray field which induces a voltage in the first and second partial induction coils and the apparatus further comprises a third induction coil positioned so that the stray field induces voltage in the third induction coil, the control apparatus being responsive to voltage induced in the first and second partial induction coils and the third induction coil for combining the voltage induced in the first and second partial induction coils and the third induction coil to cancel the voltage induced in the first and second partial induction coils and the third induction coil by variations of the stray field.

10. Apparatus according to claim 1 or claim 6 wherein the compensation coil comprises two compensation coils physically configured in a Helmholtz coil configuration.

11. Apparatus according to claim 1 or claim 6 wherein the compensation coil comprises four compensation coils physically configured in a double Helmholtz coil configuration.

12. Apparatus according to claim 1 or claim 6 wherein the magnet coil encloses an inner bore and the compensation coil is physically located in the inner bore.

13. Apparatus for use with a superconducting magnet coil which generates a main magnetic field having a field direction lying along an axis in a sample region and a stray field which extends outside of the sample region, the apparatus compensating for interference caused by components of a time-varying magnetic field generated by means external to the sample region which components lie along the axis, the apparatus comprising:
   a compensation coil surrounding the sample region for generating compensation field in the sample region;
   a plurality of induction coils, each of the plurality of induction coils having a diameter sufficiently small that the each induction coil does not surround the sample region and each induction coil being physically positioned outside the sample region at a location where substantially all the voltage induced in the each induction coil is produced by variations of the stray field and the external field axial components; and
   control apparatus responsive to the voltage induced in each of the plurality of induction coils for applying a compensation current to the compensation coil in order to generate compensation fields which cancel the external field axial components in the sample region.

14. Apparatus according to claim 13, wherein the stray magnetic field has an axial component extending along the axis and at least one of the plurality of induction coils is physically positioned at a location where a derivative in a predetermined direction of the stray magnetic field axial component substantially vanishes.

15. Apparatus according to claim 13, wherein the magnet coil has a center and wherein at least one of the plurality of induction coils is physically displaced from the center along the axis by a displacement and located off the axis and the ratio of the displacement to a distance from the location to the center is substantially 0.577.

16. Apparatus according to claim 13 wherein at least one of the plurality of induction coils is physically positioned at a first location where the stray magnetic field extends in a first direction and the external field axial components extend in a second direction and wherein at least one another of the plurality of induction coils is physically positioned at a second location where the stray magnetic field extends in a third direction opposite to the first direction and the external field axial components extend in the second direction.

17. Apparatus according to claim 13 wherein the plurality of induction coils comprises eight induction coils physically located substantially at the corner of a parallelepiped centered over the sample region.

18. Apparatus for use with a superconducting magnet coil which generates a main magnetic field having a field direction lying along an axis in a sample region and a stray field which extends outside of the sample region, the apparatus compensating for interference caused by components of a time-varying magnetic field generated by means external to the sample region which components lie along the axis, the apparatus comprising:
   a compensation coil surrounding the sample region for generating compensation fields in the sample region;
   a first induction coil physically positioned coaxially to the magnet coil and having a first diameter;
   a second induction coil physically positioned coaxially to the magnet coil and having a second diameter less than the first diameter to form a radial region between the first and second induction coils, the first and second induction coils being electrically connected in series so that voltage induced in the first and second induction coils is due solely to a magnetic field in the radial region and wherein the first and second diameters are sufficiently large that the radial region is located outside of the sample region and magnetic field in the radial region is substantially comprised of the stray field and the external field axial components; and
   control apparatus responsive to the voltage induced in the first and second induction coils for applying a compensation current to the compensation coil in order to generate compensation fields which cancel the external field axial components in the sample region.

19. Apparatus according to claim 18, wherein the stray magnetic field has an axial component extending along the axis and the first and second induction coils are physically positioned at a location where a derivative in a predetermined direction of the stray magnetic field axial component substantially vanishes.

20. Apparatus according to claim 18, wherein the magnet coil has a center and wherein the first and second induction coils are physically displaced from the center along the axis by a displacement and located off the axis and the ratio of the displacement to a distance from the location to the center is substantially 0.577.

21. Apparatus according to claim 18 wherein the apparatus further comprises a third induction coil positioned so that variations of the stray field induce voltage in the third induction coil, the control apparatus being responsive to voltage induced in the first and second induction coils and the third induction coil for combining the voltage induced in the first and second induction coils and the third induction coil to cancel the voltage induced in the first, second and third induction coils by variations of the stray field.

22. Apparatus according to claim 13 or claim 18 wherein the compensation coil comprises two compensation coils constructed and arranged to generate a substantially homogeneous compensation field in the sample region.

23. Apparatus according to claim 13 or claim 18 wherein the compensation coil comprises two compensation coils physically configured in a Helmholtz coil configuration.

24. Apparatus according to claim 13 or claim 18 wherein the compensation coil comprises four compensation coils physically configured in a double Helmholtz coil configuration.

25. Apparatus according to claim 13 or claim 18 wherein the magnet coil encloses an inner bore and the compensation coil is physically located in the inner bore.

26. Apparatus according to claim 13 or claim 18 wherein the control apparatus comprises a regulator mechanism which is responsive to voltages induced across each of the induction coils for generating a regulating signal and a current source which is responsive to the regulating signal for supplying current to the compensating coil.

27. Apparatus according to claim 13 or claim 18 wherein the control apparatus comprises:
   a digitizer responsive to voltages induced across each of the induction coils for generating an input digital signal representative of the induced voltages;
   a memory for storing predetermined control parameters;
   a computer responsive to the digital signal and to the stored parameters for generating an output digital signal representing a compensation current value; and
   at least one digital to analog converter responsive to the output digital signal for generating compensation currents for the compensation coil.

28. Apparatus according to claim 27 wherein the control apparatus further comprises means responsive to voltages induced in at least two of the induction coils for determining a gradient magnitude of the external field axial components.

29. Apparatus according to claim 27 wherein the apparatus is used in a nuclear magnetic resonance spectrometer which produces a nuclear magnetic resonance signal and the stored parameters are selected to minimize interference of the nuclear magnetic resonance signal caused by the external field axial components.

* * * * *